(12) United States Patent
Dolan et al.

(10) Patent No.: US 10,264,714 B1
(45) Date of Patent: Apr. 16, 2019

(54) AUXILIARY COOLING BY AUTOMATED COOLING UNIT

(71) Applicant: Amazon Technologies, Inc., Seattle, WA (US)

(72) Inventors: Nicole Dolan, Seattle, WA (US); Stephanie Towner, Seattle, WA (US); Brian Herman, Edmonds, WA (US)

(73) Assignee: Amazon Technologies, Inc., Seattle, WA (US)

( * ) Notice: Subject to any disclaimer, the term of this patent is extended or adjusted under 35 U.S.C. 154(b) by 173 days.

(21) Appl. No.: 15/277,918

(22) Filed: Sep. 27, 2016

(51) Int. Cl.
| | |
|---|---|
| *F24F 1/04* | (2011.01) |
| *G06F 1/20* | (2006.01) |
| *H05K 7/20* | (2006.01) |
| *G05D 1/00* | (2006.01) |
| *G05B 15/02* | (2006.01) |

(52) U.S. Cl.
CPC ......... *H05K 7/20836* (2013.01); *G05B 15/02* (2013.01); *G05D 1/0088* (2013.01); *H05K 7/20736* (2013.01)

(58) Field of Classification Search
CPC .... G05B 15/02; G05D 1/0088; H05K 7/1489; H05K 7/20836
See application file for complete search history.

(56) References Cited

U.S. PATENT DOCUMENTS

| | | | |
|---|---|---|---|
| 7,366,588 B2* | 4/2008 | Kim .......................... | F24F 3/12 700/276 |
| 8,458,849 B2 | 6/2013 | Chiu | |
| 2003/0123341 A1* | 7/2003 | Ostwald ............ | G11B 15/6835 360/92.1 |
| 2005/0111184 A1* | 5/2005 | Cliff .......................... | G06F 1/20 361/688 |
| 2006/0155421 A1* | 7/2006 | Baek .................... | G05D 1/0225 700/276 |
| 2013/0094138 A1* | 4/2013 | Meza ...................... | G06F 1/184 361/679.33 |
| 2016/0374526 A1* | 12/2016 | Yang ................... | A47L 11/4011 701/23 |
| 2017/0008162 A1* | 1/2017 | Tsubota ................. | G05B 19/00 |

\* cited by examiner

*Primary Examiner* — Abdelmoniem I Elamin
(74) *Attorney, Agent, or Firm* — Kilpatrick Townsend & Stockton LLP

(57) ABSTRACT

A facility containing electronic components can be cooled by one or more automated cooling units. One or more automated cooling units are automatically deployed to respond to temperature events at one or more electronic components by moving the automated cooling unit to the electronic component and operating a cooling assembly to pass air through an affected component, or by moving the automated cooling unit to a designated air handler or air source and supplementing a flow of air generated by the air handler. Multiple automated cooling units can be employed at the same time.

21 Claims, 20 Drawing Sheets

AUXILIARY COOLING BY AUTOMATED COOLING UNIT

BACKGROUND

A datacenter typically contains a collection of computer servers and components for the management, operation and connectivity of those servers, including power management components such as automatic transfer switches. Even in isolation, datacenter electronic components may generate sufficient heat that temperature management is important to prolong the life of the components and smooth and continuous operation of the datacenter.

Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

Datacenter electronic components may be cooled by passing air through the components. In some cases, this cooling is achieved by having individual components or groups of components equipped with fans that push air through the components. In some other cases, this cooling is achieved by providing a pressure gradient to pass cooler air from one region adjacent to the electronic components, through the components, and out of the datacenter. Such arrangements may be provided by ducting cool air to the components via an air handler, or by ducting cool air into an entire aisle (e.g. a "cool aisle") on one side of a group of electronic components, and passing the air into a "hot aisle" on an opposite side of the group of electronic components, where the warmed air is removed from the datacenter. Adverse events, however, such as a failure in a cooling system, can quickly result in unacceptably high temperatures in one or more of the electronic components.

BRIEF DESCRIPTION OF THE DRAWINGS

Various embodiments in accordance with the present disclosure will be described with reference to the drawings, in which.

DETAILED DESCRIPTION

Figure 1:
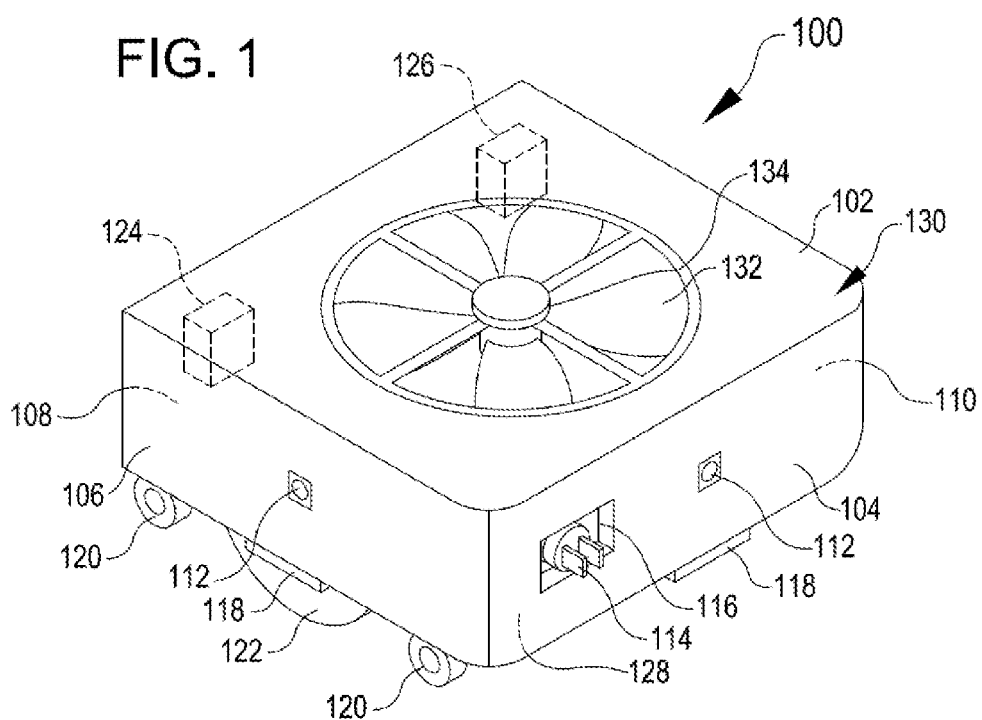
FIG. 1 is an isometric view illustration of an example of an automated cooling unit, in accordance with embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various embodiments herein described relate to apparatus and methods for regulating the temperature of electronic components. One suitable application for such apparatus and methods is in regulating the temperature of the electronic components in a datacenter. Electronic components that may require cooling include, for example, automatic transfer switches and servers. Existing strategies for temperature management include providing a flow of cool air from a sub-floor space below the electronic components, so that cool air passes up through perforated panels in the floor and through the electronic components to remove heat. Other strategies include passing ambient air through electronic components, e.g. via fans mounted within or adjacent to the components. In some cases, components may be cooled by providing a cool volume on one side of a group of electronic components (i.e. a "cool aisle") and exhausting warmed air from the other side of the group of electronic components (i.e. a "hot aisle"). Such approaches may be driven by air handlers that push air into the hot or cool aisles, by fans mounted within or adjacent to the electronic components that push or pull air therethrough, or by a combination of the above.

When an air handler or fan malfunctions, electronic components can quickly build up heat. This buildup of heat can lead to immediate component failure or to excessive wear on components that might lead to eventual failure. Systems and methods herein disclosed include autonomous and semi-autonomous systems for providing additional cooling that is targeted to components that are either overheating or at risk of overheating. In particular, systems and methods herein disclosed can detect a temperature event in a facility, such as an over-temperature warning of a server in a datacenter, and cause an automated cooling unit, or multiple automated cooling units, to deploy in the facility to address the temperature event.

In accordance with some embodiment, an automated cooling unit can include a semi-autonomous, i.e. robotic unit, which can navigate a cooled facility such as a datacenter. An automated cooling unit can preferably perform at least limited sensing and pathfinding functions onboard, e.g. via one or more onboard sensors, an onboard computer system, and a drive means such as drive wheels. An automated cooling unit can also deploy a cooling assembly, such as a fan, chiller, blower, or similar device for increasing airflow. In some cases, the cooling assembly can be a fan, chiller, or blower mounted stationary with respect to the automated cooling unit in any suitable configuration; but in other cases, the cooling assembly may be movable with respect to, and by, the automated cooling unit in order to better target a component affected by a temperature event. Various forms of automated cooling units are described herein sharing the above-referenced features. A management component can control one or multiple automated cooling units to provide for targeted cooling of affected components.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

FIG. 1 illustrates an example of an automated cooling unit 100, in accordance with embodiments. In embodiments, the automated cooling unit 100 can be substantially embodied in a casing 102 having a top 130 and bottom 128, front 104 and back 108, and sides 106, 110, with a cooling assembly 134 disposed therein. In some examples, the cooling assembly 134 is a ducted fan 132, however, in some other cases, the cooling assembly may be a blower, a chiller, or any other suitable device for moving and/or cooling a stream of air.

The automated cooling unit 100 can further include any suitable drive means, such as drive wheels 122 and/or omnidirectional wheels 120 such as castors. In some cases, the drive means can be entirely composed of drive wheels, either fixed, omnidirectional, or a combination. The automated cooling unit 100 can be powered by, an onboard power supply 124, such as a battery, and can be controlled by a control unit 126, which can include a processor and memory, a network device for connecting the automated cooling unit with a control system (such as system 900 shown in FIG. 9), and an information in-out module (user I/O) 136 for communicating with a user and/or receive input from a user, and which is operable to relay instructions to and/or autonomously control the automated cooling unit.

The automated cooling unit 100 can further include a sensor packing including, e.g., one or more horizontally-disposed sensors 112 and one or more vertically disposed sensors 118. The sensors 112, 118 may be operable to, respectively, navigate a facility by detecting obstacles and navigate by detecting cues positioned on a navigable floor space of the facility. In some cases, the automated cooling unit 100 may also include a user-accessible power connector 114, which may positioned on an outer surface of the casing 102, or may be protected in a recess 116.

Figure 2:
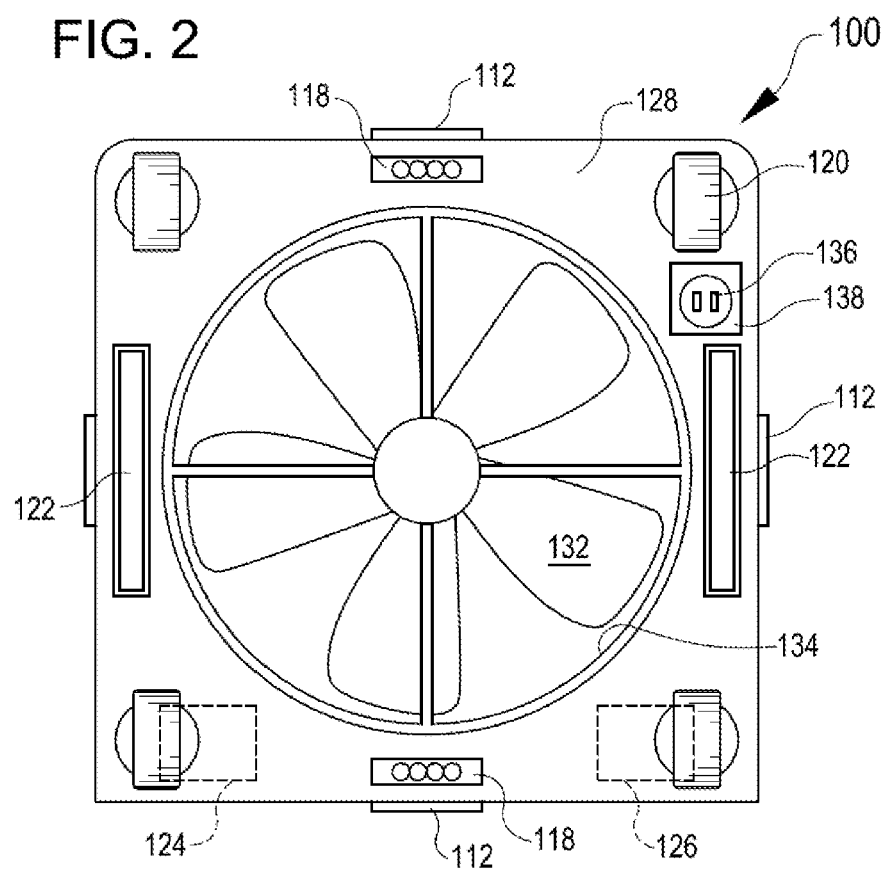
FIG. 2 is a bottom view illustration of the automated cooling unit of FIG. 1.

FIG. 2 illustrates the exemplary automated cooling unit 100 shown in FIG. 1 from a bottom view, more clearly illustrating some components. For example, the cooling unit 100 can include a down-facing power connector 136 configurable for accessing an external power supply positioned in the floor of a facility. The power connector 136 may be autonomously controlled by the control unit 126 of the automated cooling unit, or by a control system (such as system 900 shown in FIG. 9), or by both.

As illustrated, the automated cooling unit 100 shown in FIGS. 1-2 has a fixed cooling assembly 134 that is operable to move air up or down. This example of an automated cooling unit 100 can be used to increase the pressure of cool air being fed to a cooled facility from a floor vent or perforated floor.

Figure 3:
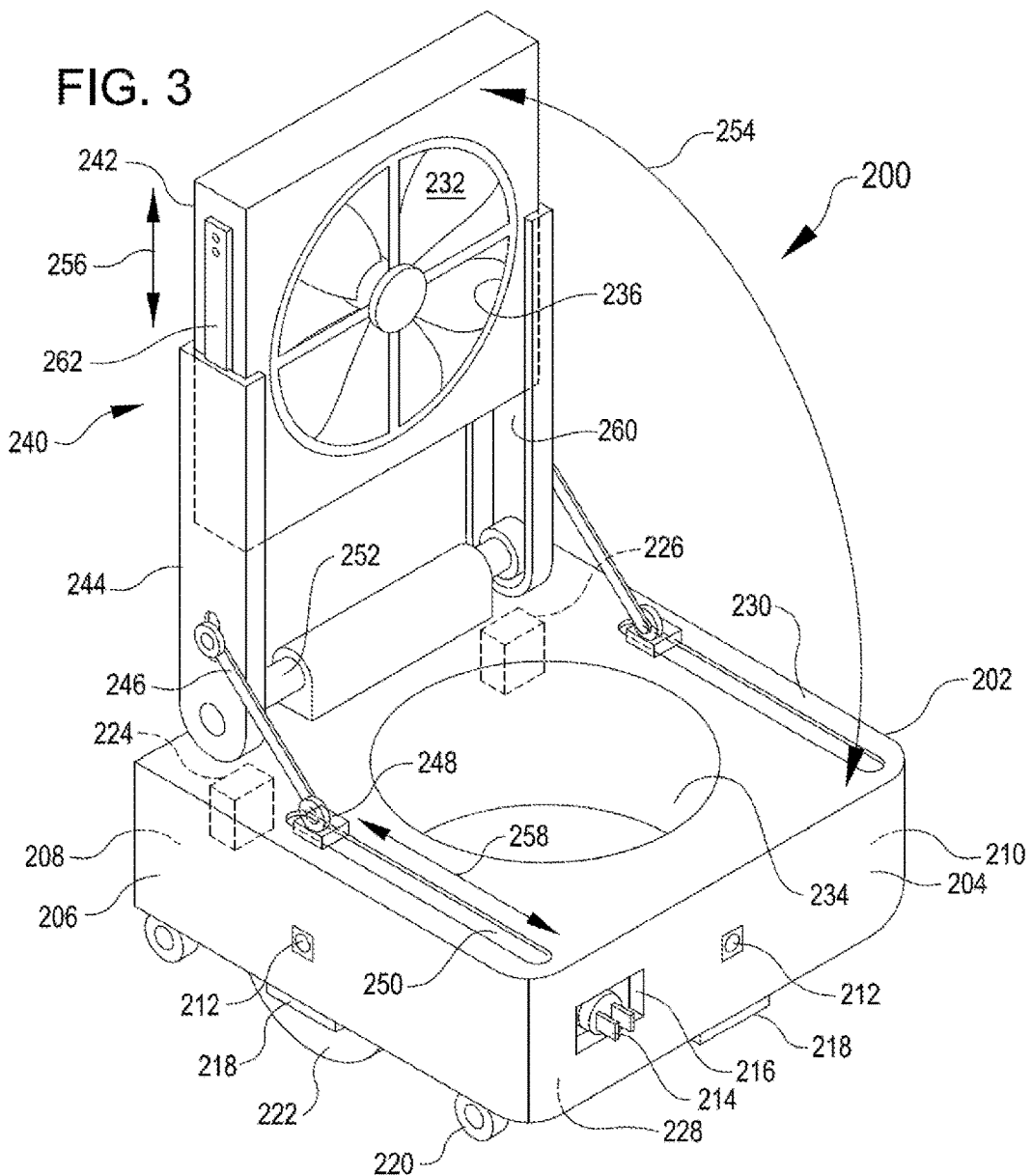
FIG. 3 is an isometric view illustration of a second example of an automated cooling unit.

FIG. 3 illustrates a second example of an automated cooling unit 200, which differs from the automated cooling unit 100 shown in FIGS. 1-2 by way of having a vertically orientable cooling assembly 236, in accordance with embodiments. The second automated cooling unit 200 may also include a casing 202 having a top 230, bottom 228, front and back 204, 208, and sides 206, 210. A collection of horizontally disposed sensors 212 can be positioned on the casing 202. Similarly, a collection of vertically disposed sensors 218 may be positioned down-facing from the casing 202, e.g. for use in detecting cues on a navigable floor.

Similar to the automated cooling unit 100 described above, the second exemplary automated cooling unit 200 can include drive means, such as drive wheels 222 and/or omnidirectional wheels 220, which may vary in form as detailed above. The automated cooling unit may be powered by an onboard power supply 224 and can include one or more power connectors 214, which may be recessed 216, for connecting the automated cooling unit with an external power source. The automated cooling unit may also be controlled via an onboard control unit 226 similar to the control unit 126 described above.

The cooling assembly 236 can include a frame 242 that can be positioned vertically. In some cases, the frame 242 can be connected with a pivoting assembly 240, which may be pivoted and/or extended to adopt different positions. For example, the frame 242 can include a pivotal connection 252 and arms 244 that are rotatingly connected with the pivotal connection to allow the frame 242 to pivot. The arms 244 may be actuated by any suitable means, including but not limited to a mechanical linkage 246 connected with an actuator 248 in a track 250, such that the travel 258 of the actuator 248 determines the angle 254 of the frame 242 with respect to the casing 202. The pivoting assembly 240 is shown in a deployed position, but may be retracted to lie flat on the casing 202, e.g. in order to permit the automated cooling unit 200 to pass underneath components in a facility. In some cases, the casing 202 can include a duct for permitting the cooling assembly 236 to operate when retracted. In some cases, the arms 244 may include additional actuators to permit the raising and lowering of the frame 242, e.g. by a vertical travel 256. The vertical travel 256 may be up to several times the size of the frame 242 by providing for one or more nested elements 262 within pockets 260 in the arms 244.

The above-described automated cooling units may be configured to deploy on a short-term basis, i.e. under battery power only; or may be configured to access power automatically from external sources while deployed. Although various access means may be used, some examples of suitable access means are described below in reference to FIGS. 4-8.

Figure 4:
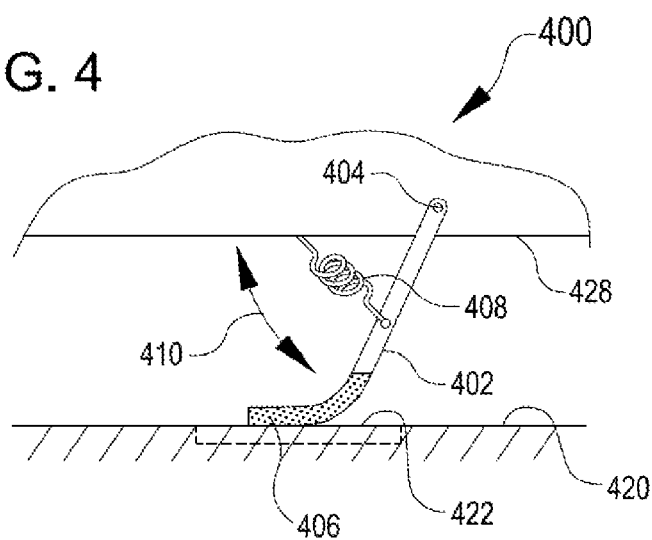
FIG. 4 illustrates an example of a power connection assembly for an automated cooling unit such as the automated cooling units of FIGS. 1 and 3.

FIG. 4 illustrates a first example of a power connection assembly 400 for an automated cooling unit such as the automated cooling units of FIGS. 1-3, in accordance with embodiments. The power connection assembly 400 includes an arm 402 that extends 410 from a pivotal connection 404, which may be positioned on an underside 428 of an automated cooling unit. The arm 402 can be pressed down, e.g. by a spring assembly 408 or comparable means, such that a contact part 406 of the arm 402 is pressed onto a contact plate 422 in a floor 420 of a facility. The contact plate 422 can provide power to the automated cooling unit.

Figure 5:
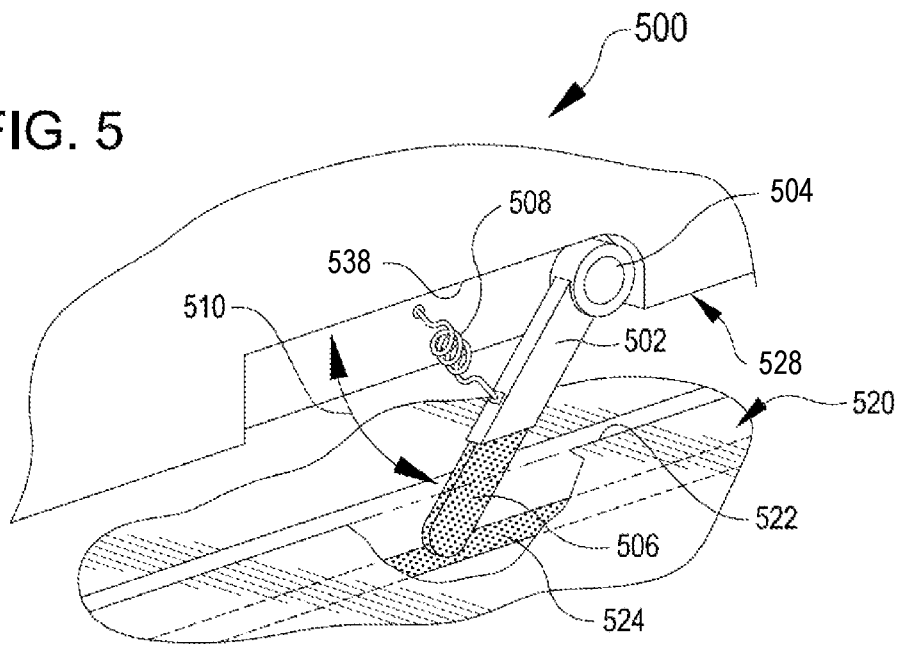
FIG. 5 illustrates a second example of a power connection assembly for an automated cooling unit such as the automated cooling units of FIGS. 1 and 3.

FIG. 5 illustrates a second example of a power connection assembly 500 for an automated cooling unit such as the automated cooling units of FIGS. 1-3, in accordance with embodiments. The power connection assembly 500 includes an arm 502 that extends 510 from a pivotal connection 504, which may be positioned on an underside 528 of an automated cooling unit, or in some cases in a cavity 538 therein. The arm 502 can be pressed down, e.g. by a spring assembly 508 or comparable means, such that a contact part 506 of the arm 502 is pressed into a channel 522 in a floor 520 of a facility. The channel 522 can contain an electrical contact 524 therein.

Figure 6:
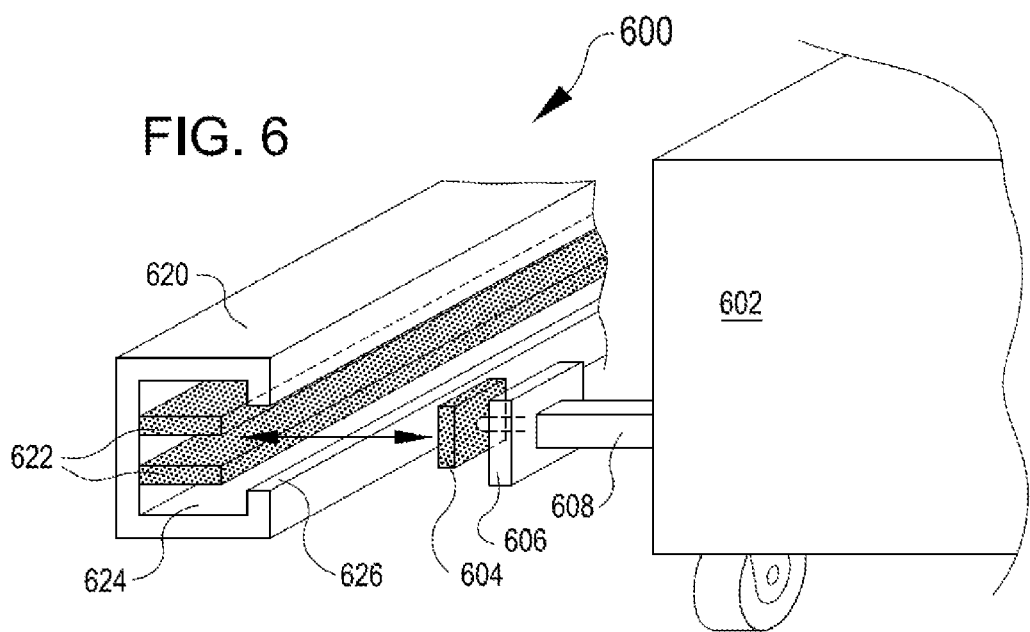
FIG. 6 illustrates a third example of a power connection assembly for an automated cooling unit such as the automated cooling units of FIGS. 1 and 3.

FIG. 6 illustrates a third example of a power connection assembly 600 for an automated cooling unit such as the automated cooling units of FIGS. 1-3, in accordance with embodiments. The power connection assembly 600 includes an arm 608 that extends outward from a casing 602 of an automated cooling unit. The arm 608 terminates in an electrical connector 604 which is sized to interact with a rail or channel 620 containing an enclosure 624 with electrical contacts 622 therein. A stop 606 may be sized to interact with the channel opening 626, in order to prevent damage to the electrical connector 604 or contacts 622 when the connector is inserted in the channel 620.

Figure 7:
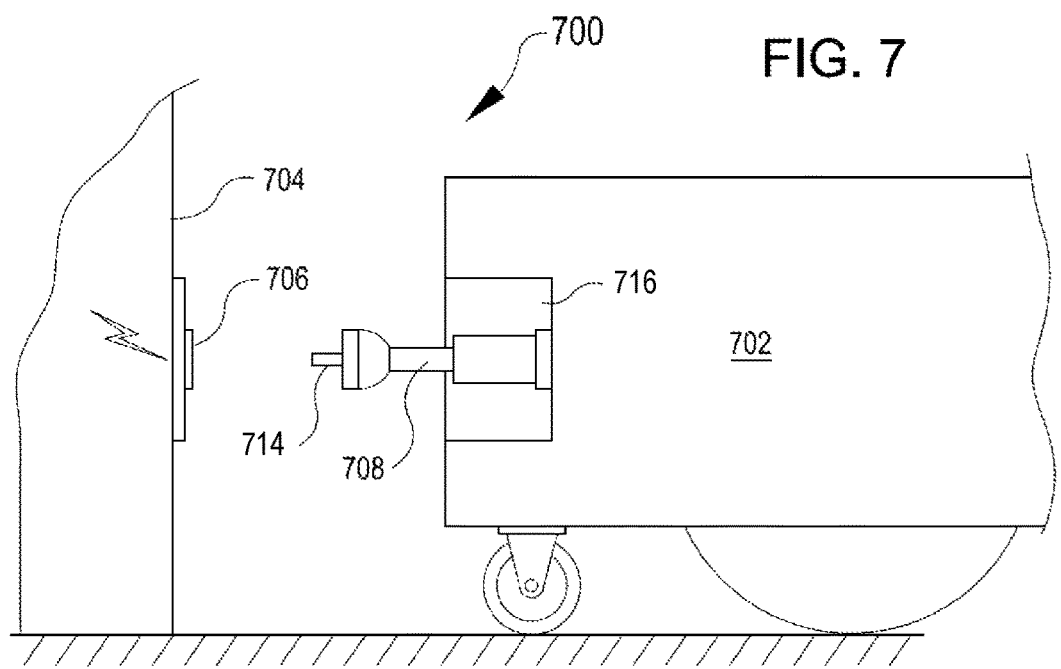
FIG. 7 illustrates a fourth example of a power connection assembly for an automated cooling unit such as the automated cooling units of FIGS. 1 and 3.

FIG. 7 illustrates a fourth example of a power connection assembly 700 for an automated cooling unit such as the automated cooling units of FIGS. 1-3, in accordance with embodiments. The power connection assembly 700 includes an arm 708 that extends outward from a casing 702 of an automated cooling unit. The arm 708 terminates in an electrical connector 704 which is sized to interact with a socket 706. In some cases, the socket 706 may be a conventional wall socket. In some other cases, the socket 706 may be any standardized electrical socket. The socket 706 may be connected with a charging station 704. In some cases, the arm 708 may be robotic, such that it can extend to contact the socket 706 and retract when not in use.

Figure 8:
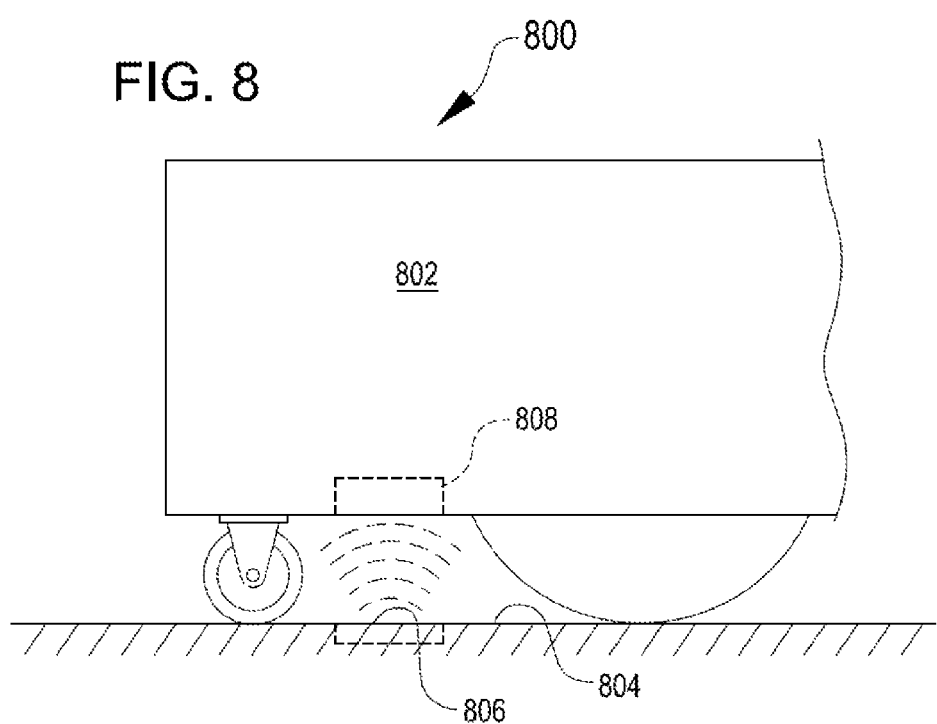
FIG. 8 illustrates a fifth example of a power connection assembly for an automated cooling unit such as the automated cooling units of FIGS. 1 and 3.

FIG. 8 illustrates a fifth example of a power connection assembly 800 for an automated cooling unit such as the automated cooling units of FIGS. 1-3, in accordance with embodiments. The power connection assembly 800 includes a wireless charging element 808, such as an inductive transducer, positioned within a casing 802 of an automated cooling unit. When the wireless charging element 808 is positioned above a wireless charging station 806 in the floor 804 of a facility, the wireless charging element can receive power.

Figure 9:
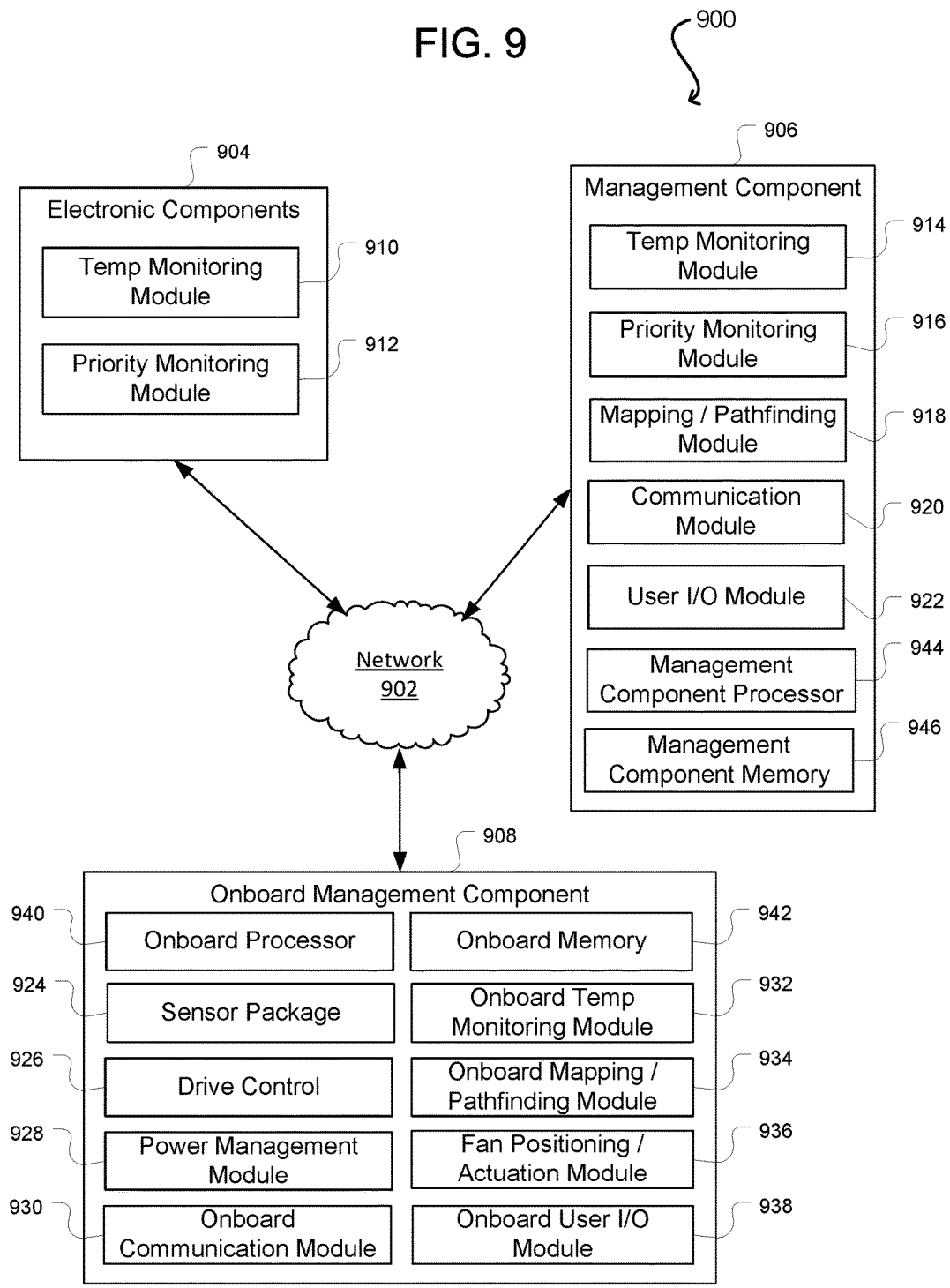
FIG. 9 is a simplified schematic diagram illustration of a system for controlling an automated cooling unit for supplemental cooling of electronic components.

FIG. 9 diagrammatically illustrates a system 900 for controlling one or more automated cooling units, such as the automated cooling units 100, 200 shown in FIGS. 1-3, in a datacenter in accordance with embodiments.

For example, the onboard control elements 126 or 226 of the above-referenced automated cooling units 100, 200 can include any or all of, or any suitable combination of, the following elements. An onboard management component 908 can include, e.g., onboard processor 940 and memory 942 for maintaining some or all of the following modules. Controllers for the sensor package 924 can operate and retrieve data from sensors, such as the sensors 112 shown in FIG. 1. A drive control module 926 can actuate and control the positioning of the automated cooling units. A power management module 928 can detect the power supplies of the automated cooling units, e.g. for providing a low power alert when the automated cooling unit has depleted an onboard power supply; and may also be operable to actuate an electrical connector for connecting to an external power supply. An onboard communication module 930 can facilitate communication between the onboard management component 908, via a network 902, with either the management component 906 or one or more electronic components 904. An onboard temperature monitoring module 932 can be operable to monitor an ambient temperature, e.g. for detecting an exception such as a fire. An onboard mapping and/or pathfinding module 934 can be operable to control an automated cooling unit's route during deployment. A cooling assembly positioning and actuation module 936 can be operable for determining a position for deploying a cooling assembly of the automated cooling unit. Finally, an onboard user input/output module 938 can be operable for permitting the automated cooling unit to receive instructions either directly from a user or via the network from a networked input device operated by a user.

The onboard management component 908 preferably provides for direct access by a human user to issue commands to the associated automated cooling unit, e.g. via the user input/output module on the automated cooling unit, such as the user I/O module 138 shown in FIG. 1. For example, a technician can issue a "return to home" command, which would cause the automated cooling unit to return to a charging station, standby station, or other suitable location to wait for further instructions. The user input/output module also preferably provides for direct or manual control over the automated cooling unit, either by a control panel situated on the automated cooling unit itself, via remote control, by way of voice commands, or other suitable means of control.

The management component 906 is in networked communication with the onboard management components 908 of each automated cooling unit, and includes a management component processor 944 and memory 946. In some cases, the onboard management component 908 can be remotely controlled by the management component 906, or may operate semi-autonomously by receiving instructions from the management component 906 at intervals. The management component 906 can include a temperature monitoring module 914 for receiving temperature information from the electronic components, 904. The electronic components can include embedded temperature monitoring modules 910 which can alert the management component 906 when an electronic component has begun to overheat. The electronic components 904 can also include a priority monitoring module, which can alert the management component 906 when one or another electronic component has a higher priority, e.g. when a server in a group of servers has been assigned a critical task. The temperature monitoring module 910 may also provide information back to the management component 906 when an exception has occurred, such as an electronic component 904 being taken off-line, or an excessive over-temperature indicative of a fire (in which case additional airflow would be undesirable).

The management component 906 can include matching temperature monitoring modules 914 and priority monitoring modules 916 for maintaining a local status of the electronic components 904. In addition, the management component 906 can implement a mapping and pathfinding module 918 for providing instructions to the onboard management component 908 of an automated cooling unit, particularly if multiple automated cooling units are in transit. The management component 906 can also include a communication module 920 for facilitating the networked communication with the onboard management component 908 and the electronic components 904, a user input and output module 922 for receiving user instructions, which may include requests to recall deployed automated cooling units, to enter an exception such as a fire, or similar instructions. The above-referenced system can be operable to implement supplemental cooling in a facility autonomously to cover various circumstances, according to at least the following non-limiting examples. The following examples are described with reference to datacenter components, but may be applied to any comparable facility that employs frequent or continuous cooling.

Figure 10:
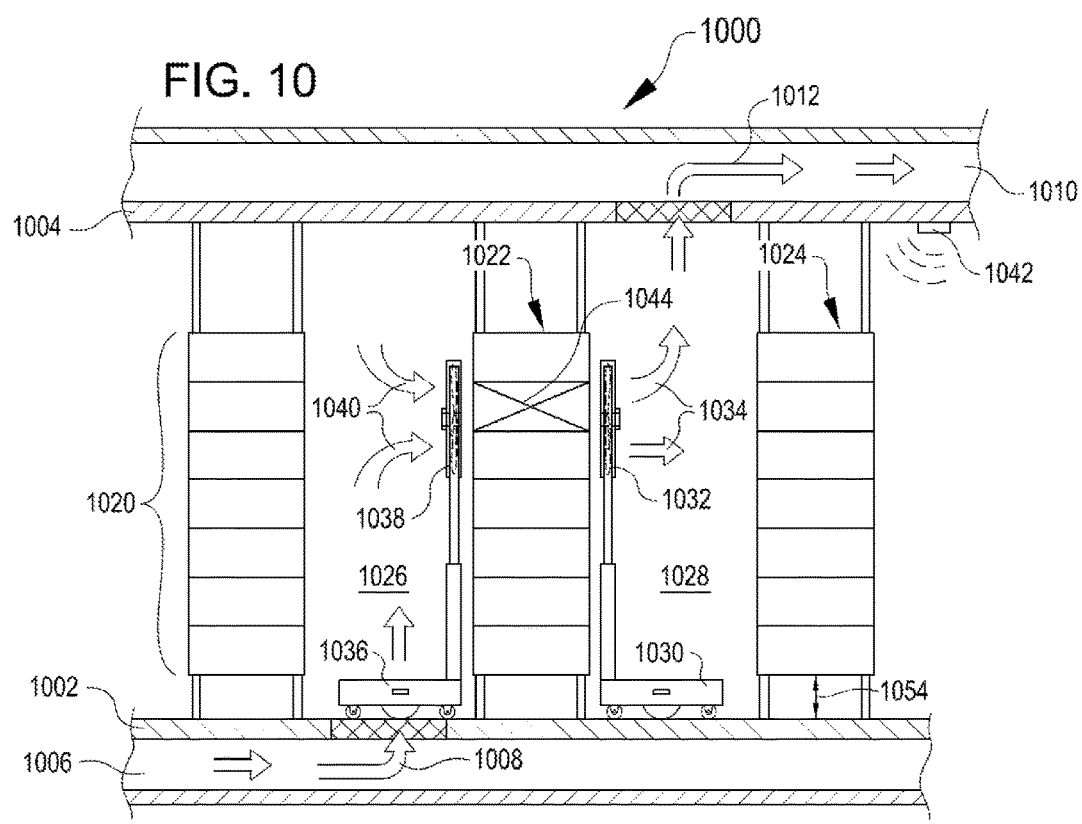
FIG. 10 is a side view diagrammatic illustration of a datacenter employing automated cooling units in a first exemplary configuration, in accordance with embodiments.

FIG. 10 shows a diagrammatic illustration in a side view of a system 1000 employing automated cooling units 1036, 1030 in a first exemplary configuration, in accordance with embodiments. The system 1000 includes three server racks 1020, 1022, 1024 spaced apart, with a cold row 1026 between the first and second racks 1020, 1022; and a hot row 1028 between the second and third racks 1022, 1024. A cool flow of air 1008 is admitted to the cold row 1026 from a sub-floor duct 1006 under a navigable floor 1002. Warm air 1012 is exhausted through the ceiling 1004 into an exhaust duct 1010.

The system 1000 includes a management component 1042 which is in communication with the automated cooling units 1036, 1030, which have been dispatched to respond to a temperature event at an affected electronic component 1044 in the second rack 1022. A first automated cooling unit 1030, in response to instructions from the management component 1042, has deployed a cooling unit 1032 adjacent the electronic component 1044, and is pulling a stream of air 1034 from the electronic component. A second automated cooling unit 1036 has been dispatched to respond to the same temperature event, and has deployed a cooling unit 1038 adjacent the electronic component 1044, and is pushing a flow of cool air 1040 into the electronic component. Although FIG. 10 shows both first and second automated cooling units 1036, 1030 operating simultaneously, it will be well understood that only one automated cooling unit might be needed at a time; or more than one automated cooling unit may respond to a temperature event depending on the availability of the automated cooling units and/or on the severity of the temperature event. In alternative embodiments, one or the other of the two automated cooling units shown 1030, 1036 may be deployed as shown rather than both. In some cases, the automated cooling units 1030, 1036 may be able to retract and fold down the cooling units 1032, 1038 so as to be capable of passing underneath a height 1054 of one or more racks of electronic components. Where only one automated cooling unit is deployed at a time, the system 1000 may prioritize positioning automated cooling units in the cold row 1026 or the hot row 1028.

Figure 11:
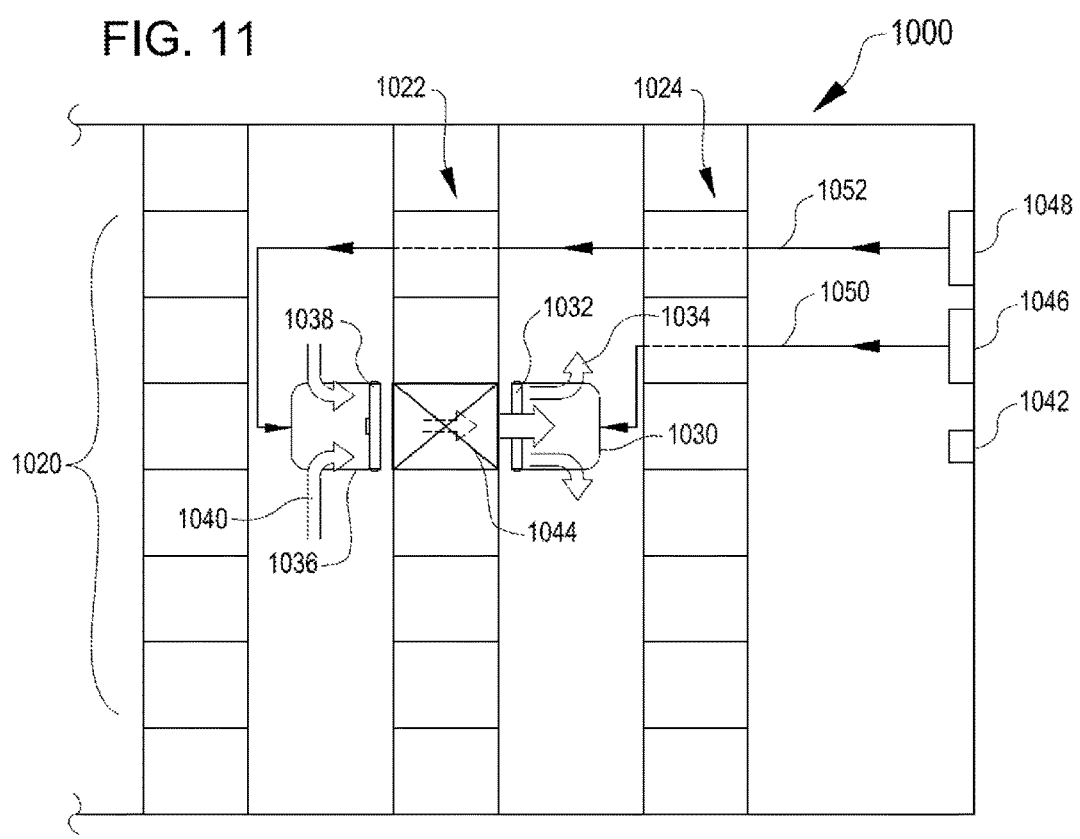
FIG. 11 is a top view diagrammatic illustration of the exemplary configuration according to FIG. 10.

FIG. 11 shows the exemplary configuration of the system 1000 according to FIG. 10, in a diagrammatic top-down view. In this view, charging stations 1046, 1048 are shown, from which both of the automated cooling units 1030, 1036 were dispatched along different paths 1050, 1052. The automated cooling units 1030, 1036 are operable to increase the local flow rate of air through the affected electronic component 1044.

Figure 12:
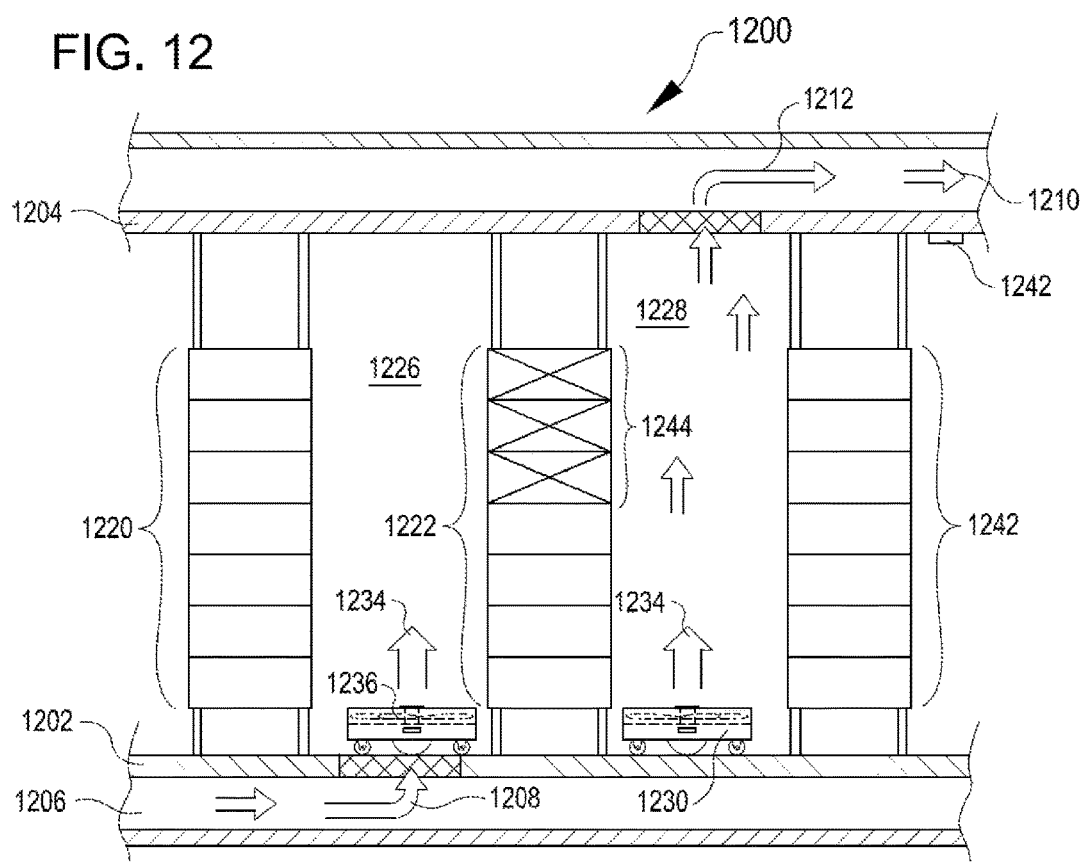
FIG. 12 is a side view diagrammatic illustration of a datacenter employing automated cooling units in a second exemplary configuration, in accordance with embodiments.

FIG. 12 shows a diagrammatic illustration in a side view of a system 1200 employing automated cooling units 1236, 1230 in a second exemplary configuration, in accordance with embodiments. The system 1200 includes three server racks 1220, 1222, 1224 spaced apart, with a cold row 1226 between the first and second racks 1220, 1222; and a hot row 1228 between the second and third racks 1222, 1224. A cool flow of air 1208 is admitted to the cold row 1226 from a sub-floor duct 1206 under a navigable floor 1202. Warm air 1212 is exhausted through the ceiling 1204 into an exhaust duct 1210. A selection of electronic components 1244 is affected by a temperature event.

In the second system 1200, a first automated cooling unit 1230, based on instructions by the management component 1242, is generating a vertical flow of air 1234 which can supplement a rate of exhausting hot air from the hot aisle 1228 adjacent to the selection of electronic components. A second automated cooling unit 1236 is also generating a vertical flow of air 1234 near the affected electronic components 1244, which locally increases the influx of cool air from the sub-floor duct 1206. One or both of the two automated cooling units 1230, 1236 may be used for responding to temperature events in selections of co-located electronic components 1244. In alternative embodiments, a combination of automated cooling units may be used wherein some units produce a vertical flow of air (see, e.g. automated cooling unit 100 of FIGS. 1-2) and wherein some units can produce a targeted, horizontal flow of air (see, e.g., automated cooling unit 200 of FIG. 3). Although FIG. 12 shows automated cooling units 1230, 1236 operating in both the hot aisle 1228 and the cold aisle 1226 simultaneously, it will be well understood that only one automated cooling unit might be needed at a time. In some cases, the system 1200 may prioritize operation of a single automated cooling unit in one of the hot or cold aisles. For example, the system 1200 might preferentially operate the automated cooling unit 1230 in the cold aisle 1226. In some cases, where a temperature event is severe, the system 1200 may operate two or more automated cooling units; and may deploy the automated cooling units within the same aisle or in different aisles.

Figure 13:
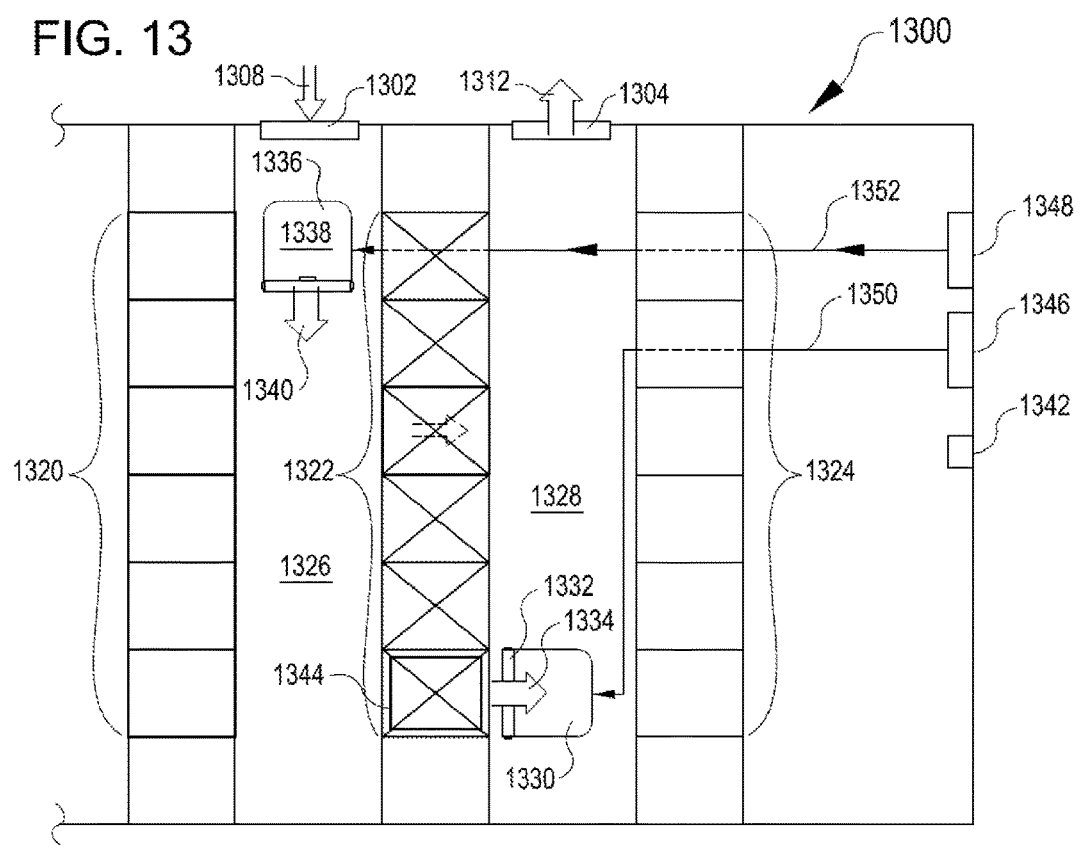
FIG. 13 is a top view diagrammatic illustration of a datacenter employing automated cooling units in a third exemplary configuration, in accordance with embodiments.

FIG. 13 shows a diagrammatic illustration in a top-down view of a system employing automated cooling units 1330, 1336 in a third exemplary configuration, in accordance with embodiments. The system 1300 includes three server racks 1320, 1322, 1324 spaced apart, with a cold row 1326 between the first and second racks 1320, 1322; and a hot row 1328 between the second and third racks 1322, 1324. A cool flow of air 1308 is admitted to the cold row 1326 from a first air handler 1308, and warm air 1312 is exhausted through by way of a second air handler 1304. In the illustrated configuration, a defective first air handler 1308 has caused a temperature event across multiple electronic components (i.e., the second server rack 1322). In addition, a priority component 1344 is associated with the affected components.

In the third system 1300, a first automated cooling unit 1330, based on instructions by the management component 1342, has been dispatched from standby 1346 along a first path 1350 to take station adjacent to the priority component 1344. The first automated cooling unit 1330 is shown pulling a flow of air 1334 through the priority component 1344 by way of its cooling unit 1332. Electronic components may be designated priority components automatically, such as by category. For example, a client-facing web server may take a higher priority than a backup server, or similar. In some cases, the priority of a particular electronic component may be set by a user. Although FIG. 13 shows the first automated cooling unit 1330 pulling air through the priority component 1344 from the hot aisle 1328, it will be understood that the first automated cooling unit 1330 may instead be deployed to the cold aisle 1326 to push air through the priority component 1344.

The second automated cooling unit 1336 has been dispatched from standby 1348 along a second path 1352 to take up station adjacent the first air handler 1308. The automated cooling unit 1336 is shown deploying its cooling unit 1338 to assist the first air handler 1302 and increase airflow into the cold aisle 1326. In various alternative cases, the first and second automated cooling units 1330, 1336 may be deployed to the same aisle or to different aisles.

Figure 14:
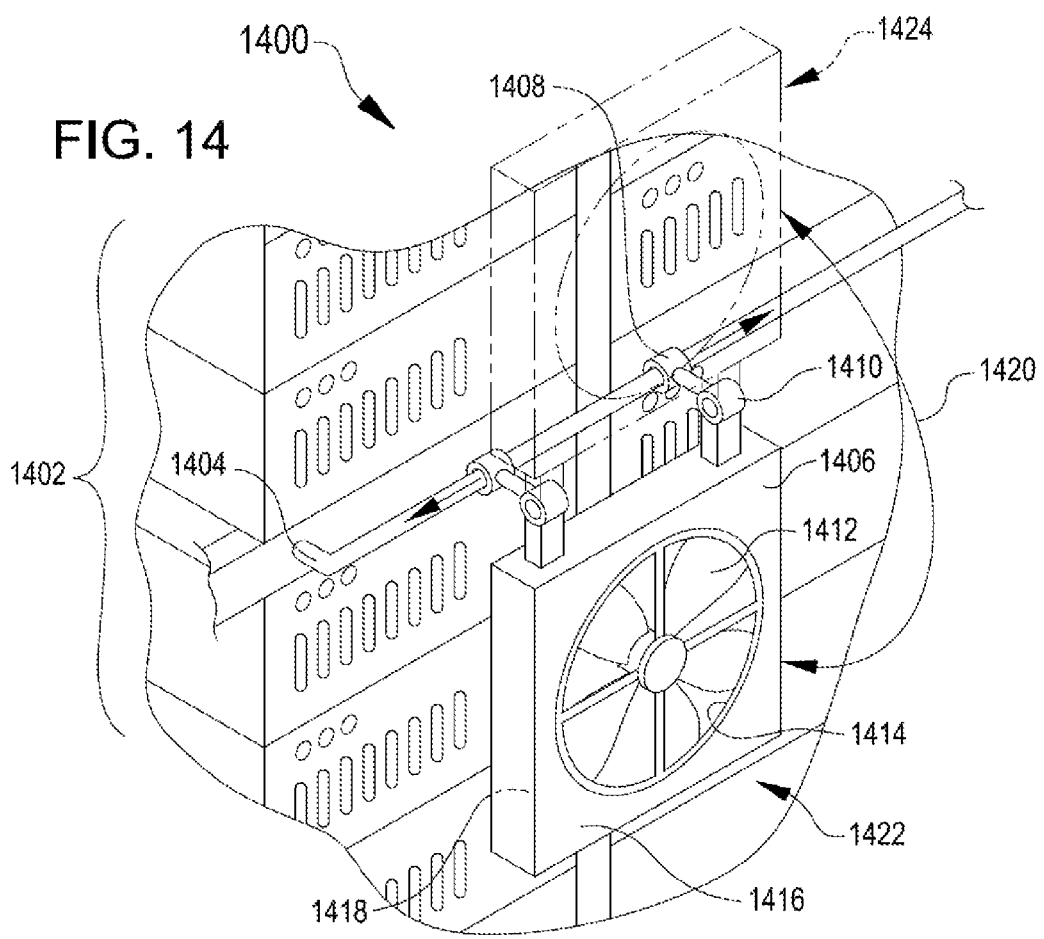
FIG. 14 illustrates an example of an automated cooling unit suspended from a rail, in accordance with embodiments.

FIG. 14 illustrates a heat management system 1400 that includes an automated cooling unit 1406 suspended from a rail 1494, in accordance with embodiments. The rail 1404 is positioned proximate to a rack of electronic components 1402 and may be configured to provide electrical power to the automated cooling unit 1406. The automated cooling unit 1406 is connected with the rail 1404 by connectors 1408 which allow the automated cooling unit to move transversely along the rail. The automated cooling unit 1406 includes a fan 1412 contained in a duct 1414. The casing 1406 of the automated cooling unit 1406 includes a first side 1416, and a second side 1418. In operation, the automated cooling unit 1406 may hang in a low position 1422 with the first side 1416 facing outward in order to provide cooling to electronic components below the rail 1404. In some cases, the automated cooling unit 1406 may flip upward 1420 about an axis 1410 to a high position 1424 in order to provide cooling to electronic components above the rail 1404.

Figure 15:
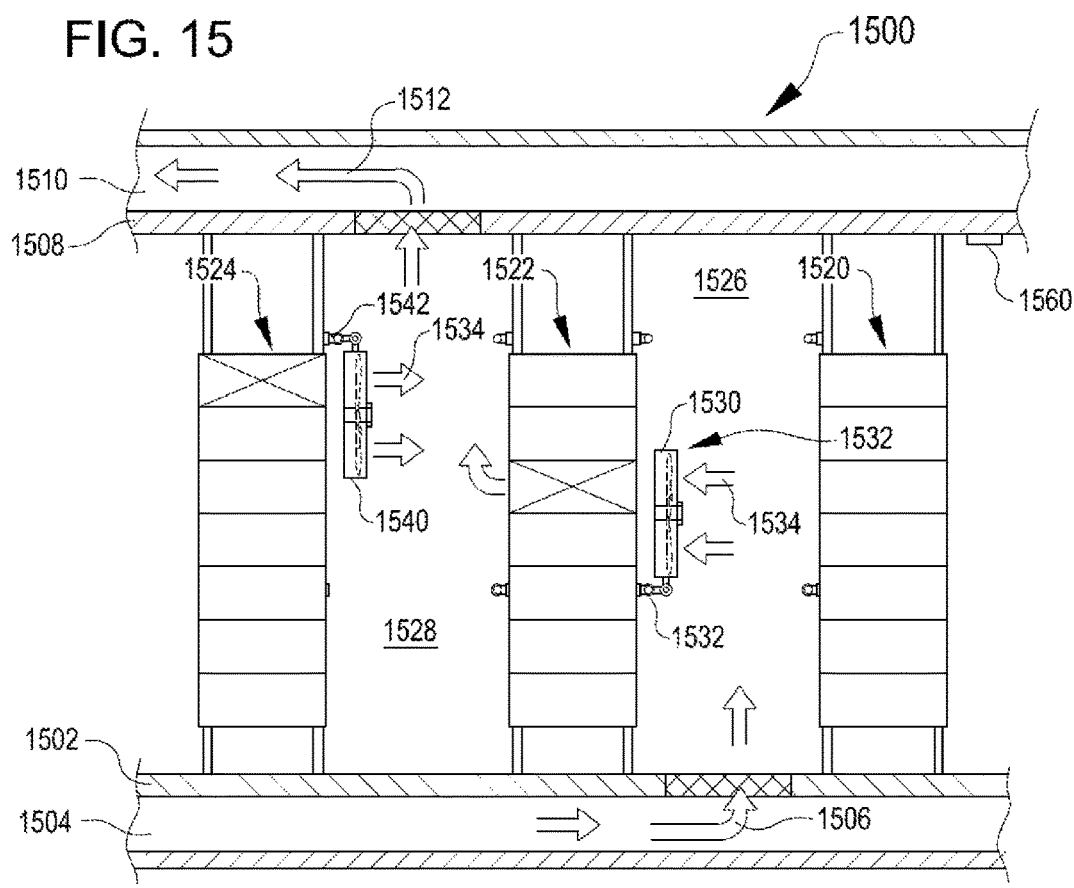
FIG. 15 is a side view diagrammatic illustration of a datacenter employing rail-mounted automated cooling units as shown in FIG. 14 in an exemplary configuration, in accordance with embodiments.

FIG. 15 shows a diagrammatic illustration in a side view of a system 1500 employing rail-mounted automated cooling units 1540, 1530, similar to the rail-mounted automated cooling unit 1406 shown in FIG. 14, in accordance with embodiments. The system 1500 includes three server racks 1520, 1522, 1524 spaced apart, with a cold row 1526 between the first and second racks 1520, 1522; and a hot row 1528 between the second and third racks 1522, 1524. A cool flow of air 1506 is admitted to the cold row 1526 from a sub-floor duct 1504 under a navigable floor 1502. Warm air 1512 is exhausted through the ceiling 1508 into an exhaust duct 1510. A selection of electronic components 1546, 1548 has been affected by temperature events. A first automated cooling unit 1530 has been deployed by a management component 1560 to a first affected electronic component 1546. The first automated cooling unit 1530 has rotated upward from its rail 1532 to access the affected electronic component 1546, and is passing a flow of cool air 1534 from the cold aisle 1526 and pushing it into the affected electronic component. Conversely, a second automated cooling unit 1540 is suspended downward from its respective rail 1542. The second automated cooling unit 1540 is pulling air 1544 from the second affected electronic component 1548 into the hot aisle 1528.

Figure 16:
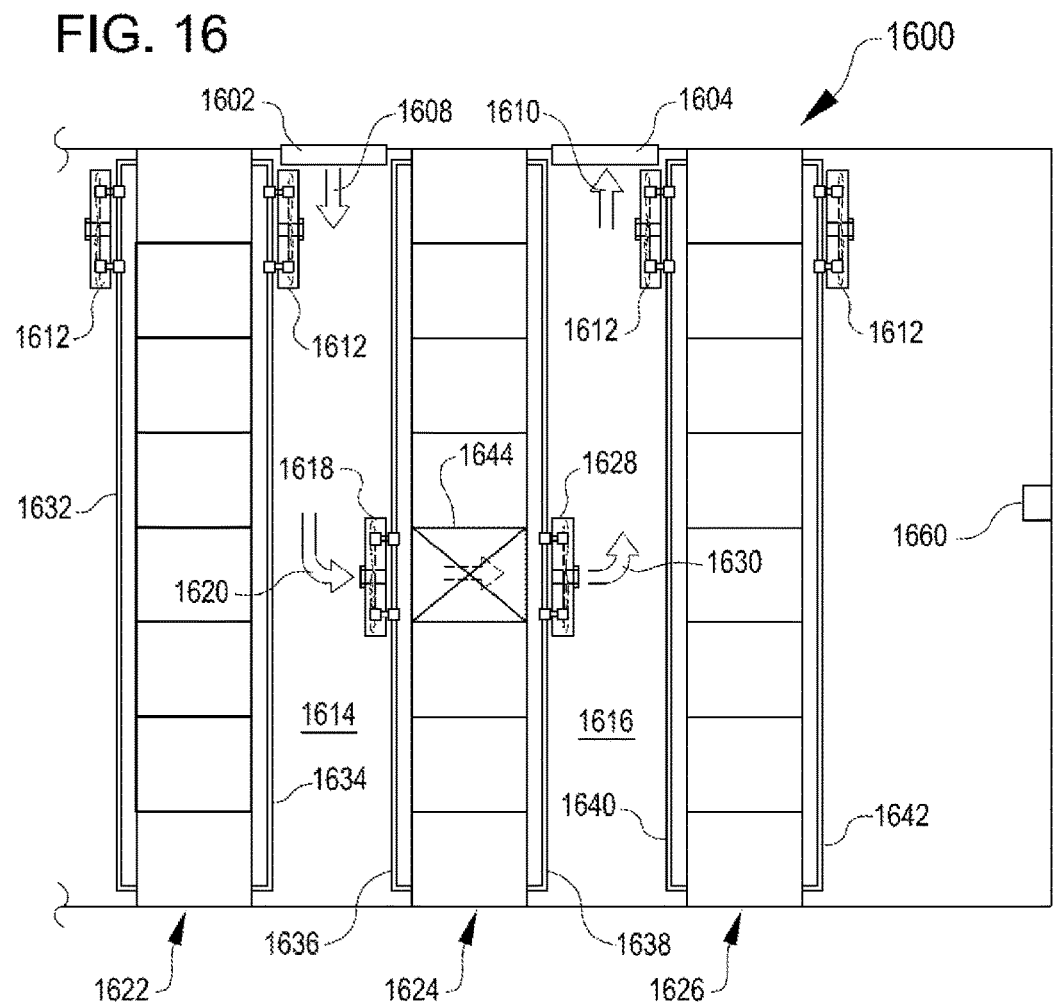
FIG. 16 is a top view diagrammatic illustration of a datacenter employing rail-mounted automated cooling units as shown in FIG. 14 in another exemplary configuration, in accordance with embodiments.

FIG. 16 shows a diagrammatic illustration in a top-down view of a system 1600 employing rail-mounted automated cooling units 1618, 1628 similar to the automated cooling unit 1406 shown in FIG. 14 in another exemplary configuration, in accordance with embodiments. In particular, this view shows how active automated cooling units 1618, 1628 may be deployed while inactive automated cooling units 1612 hold station. For example, the system 1600 includes a first electronic component rack 1622, a second rack 1624, and a third rack 1626. Rails 1632, 1634, 1636, 1638, 1640, and 1642 are disposed, respectively on each side of each electronic component rack. A cold aisle 1614 is disposed between the first and second electronic component racks 1622, 1624, and is fed a stream of air 1608 via a first air handler 1602. A hot aisle 1616 is disposed between the second and third electronic component racks 1624, 1626, and exhausts a stream of exhaust air 1610 via a second air handler 1604.

In response to a temperature event in an affected electronic component 1644, a management component 1660 has deployed first and second automated cooling units 1618, 1628 which are on rails 1636, 1638 adjacent to the affected electronic component 1644. The first automated cooling unit 1618, which is positioned in the cold aisle 1614, pushes a cool stream of air 1620 from the cold aisle into the affected electronic component 1644. The second automated cooling unit 1628, which is positioned in the hot aisle 1616, pulls a stream of warmed air 1630 out of the affected electronic component 1644. Although FIG. 16 shows the first and second automated cooling units 1618, 1628 working together to push air through the affected electronic component 1644, it will be understood that one or the other automated cooling unit may instead be used alone. In some cases, rails may be provided at only the cold aisles, or at only the hot aisles. In such a case, the rail-mounted automated cooling units might only be available in the cold aisles or in the hot aisles.

The above-described cases are meant to be illustrative of some of the specific configurations by which automated cooling units are controlled to provide auxiliary cooling to a system. The modular nature of the above-referenced automated cooling units may provide for various combined systems employing more than one type of automated cooling unit in tandem. For example, in some cases, a facility cooling system might incorporate both rail-mounted automated cooling units and robotic automated cooling units that roll on the floor.

Figure 17:
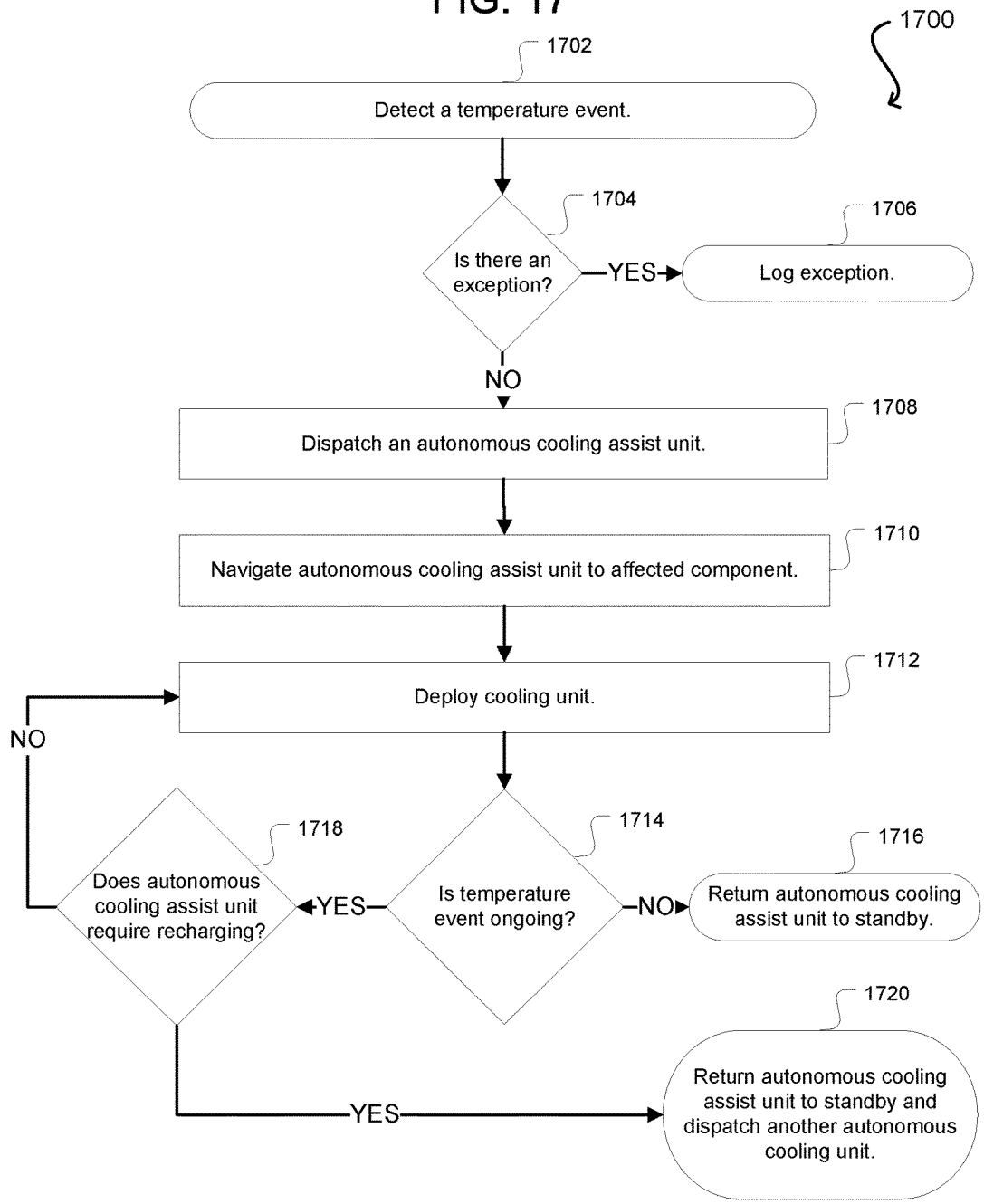
FIG. 17 illustrates a first example process for providing auxiliary cooling to an electronic component.

FIG. 17 illustrates a first example process 1700 for providing auxiliary cooling to a cooled facility, in accordance with embodiments. Steps shown in the example process 1700 can be implemented in accordance with systems for controlling one or more automated cooling units, for example as shown in system 900 of FIG. 9. In some embodiments, a temperature event can be detected (act 1702). In some cases, the temperature event can be recorded by an affected electronic component and pushed to a management component, or in other cases, the management component can query the electronic components and determine, based on temperature data, whether a temperature of an electronic component exceeds a preferred operating temperature. In some cases, the system also queries whether there has been an exception (act 1704). Some exceptions may include a fire alarm, over-temperature indicative of a fire, a recall order by a user, or similar exceptions. When an exception is detected, the system may log the exception (act 1706) and stop taking action.

When no exception is detected, an automated cooling unit may be dispatched (act 1708). In some cases, a management component may map a route for the automated cooling unit to use for navigating to the affected electronic component (act 1710). When the automated cooling unit has arrived in a vicinity of the affected component, in can deploy its cooling assembly and begin to cool the affected electronic component (act 1712). The system can periodically verify whether a temperature event is ongoing (act 1714) and, in the event that the temperature event is concluded (e.g., when repaired or when taken off-line) can return to a stand-by state (act 1716), which can include redeploying to a new task, or can include returning to a charging station, waiting area, or other suitable standby state.

If the temperature event is still ongoing, the system can determine whether the automated cooling unit has sufficient charge to continue on batter (act 1718) and, if there is sufficient charge, the automated cooling unit can continue to deploy its cooling assembly to cool the electronic component. If there is insufficient remaining charge, the automated cooling unit can be redeployed to standby or to a charging station, which can trigger the dispatch of an additional automated cooling unit to take over providing emergency cooling to the affected electronic component (act 1720).

Figure 18:
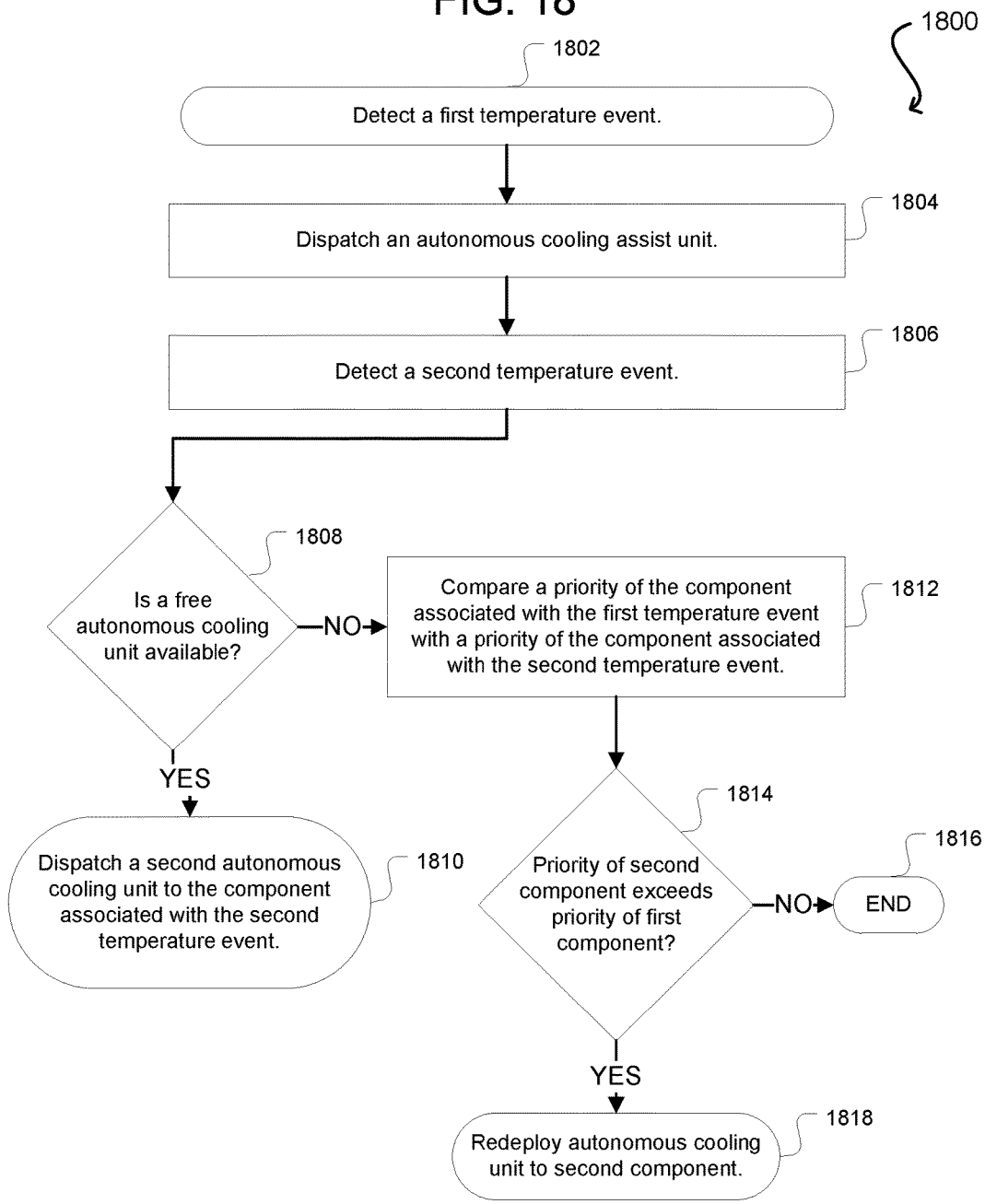
FIG. 18 illustrates a second example process for providing auxiliary cooling to an electronic component.

FIG. 18 illustrates a second example process 1800 for providing auxiliary cooling to a cooled facility, in accordance with embodiments. Steps shown in the example process 1800 can be implemented in accordance with systems for controlling one or more automated cooling units, for example as shown in system 900 of FIG. 9. The second example process 1800 addresses aspects of the system prioritizing the deployment of an automated cooling unit to one or another temperature event when multiple events have occurred. For example, in some cases, a first temperature event can be detected at a first electronic component (act 1802). In response, an automated cooling unit can be dispatched to the first electronic component (act 1804). A second temperature event can then be detected (act 1806), which can trigger the system to determine whether any additional automated cooling units are available (act 1808). If additional automated cooling units are available, then a second automated cooling unit can be dispatched to address the second temperature event (act 1810).

However, in the event that no additional automated cooling units are available, a priority of the first affected component can be retrieved and compared to a priority of the second affected component (act 1812). Priority of components may be automatically determined based on, for example, a usage of a component in some cases. In other cases, priority may be assigned by a user, or may be associated with a particular task type, such as client-facing as opposed to internal, or active as opposed to backup, or other suitable criteria. The system can determine whether a priority of the second affected component exceeds the priority of the first affected component (act 1814). If the second electronic component does not exceed the first in priority, then the system can continue the initial dispatch of the automated cooling unit (act 1816). If the second electronic component is a higher priority than the first, then the system can redeploy the automated cooling unit to the second electronic component (act 1818).

Figure 19:
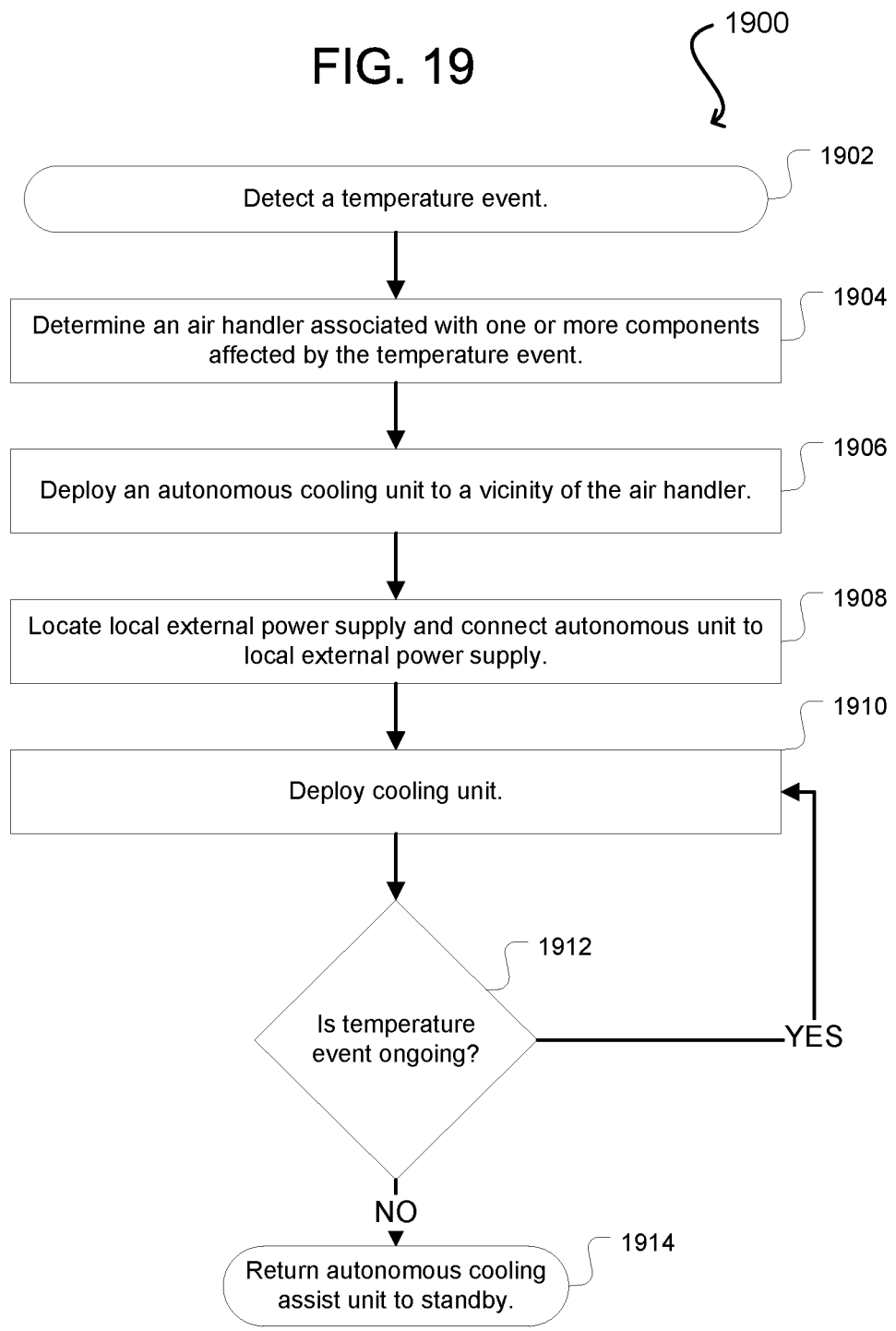
FIG. 19 illustrates a third example process for providing auxiliary cooling to an electronic component.

FIG. 19 illustrates a third example process 1900 for providing auxiliary cooling to a cooled facility, in accordance with embodiments. Steps shown in the example process 1900 can be implemented in accordance with systems for controlling one or more automated cooling units, for example as shown in system 900 of FIG. 9. The third example process 1900 addresses aspects of systems that employ distributed external power supplies for use by the automated cooling units. The third example process 1900 also addresses systems that can deploy to provide backup air handling as opposed to direct cooling. For example, in some cases, a temperature event can be detected (act 1902). The system can determine an air handler associated with a component or group of components affected by the temperature event (act 1904), and can deploy an automated cooling unit to the air handler (act 1906). The system can locate an external power supply, such as a contact patch, channel, socket, or other suitable external power supply, and can direct the automated cooling unit to connect itself with the external power supply (act 1908). In some cases, the system can instead generate an indication, i.e. for a user, requesting a connection. The system can then cause the automated cooling unit to deploy its cooling assembly (act 1910). The system can periodically check whether the temperature event is still ongoing (act 1912) and either continue cooling the affected electronic component if the event is ongoing, or cause the automated cooling unit of return to standby if the temperature event is concluded (act 1914).

Figure 20:
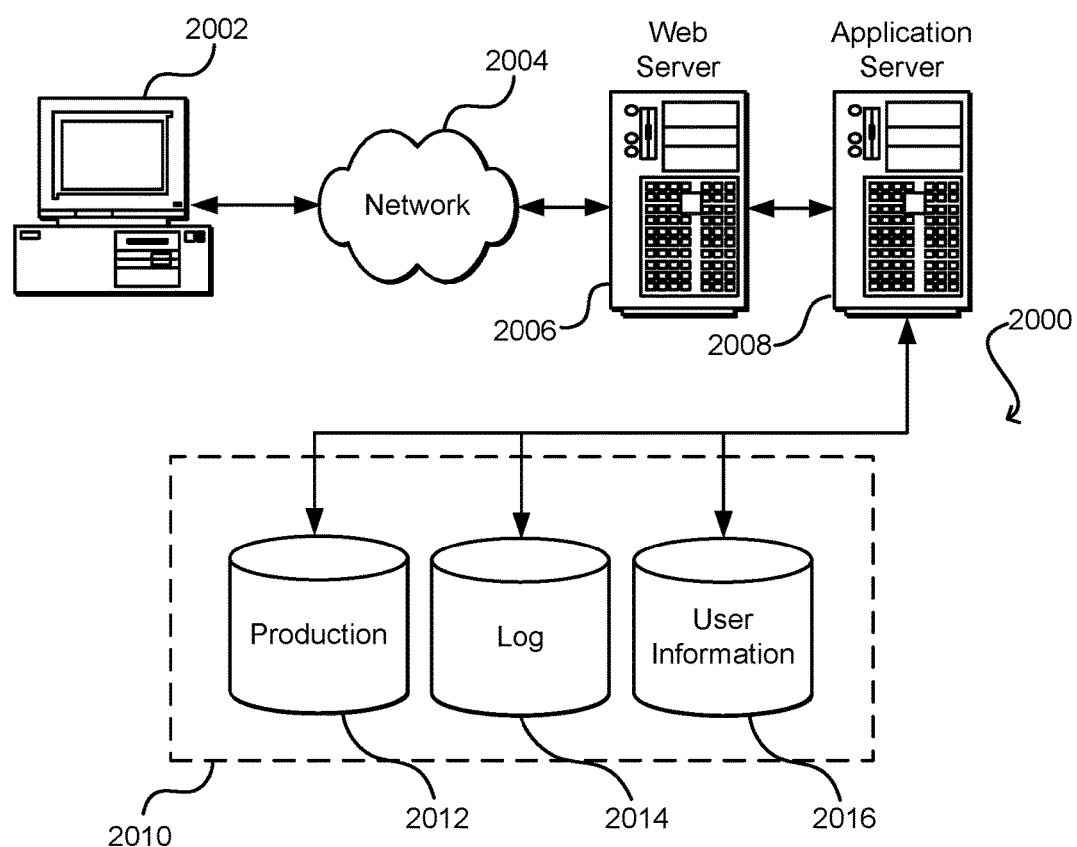
FIG. 20 illustrates an environment in which various features of a cooling system can be implemented, in accordance with at least one embodiment.

FIG. 20 illustrates aspects of an example environment 2000 for implementing aspects in accordance with various embodiments. As will be appreciated, although a Web-based environment is used for purposes of explanation, different environments may be used, as appropriate, to implement various embodiments. The environment includes an electronic client device 2002, which can include any appropriate device operable to send and receive requests, messages, or information over an appropriate network 2004 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 2006 for receiving requests and serving content in response thereto, although for other networks an alternative device serving a similar purpose could be used as would be apparent to one of ordinary skill in the art.

The illustrative environment includes at least one application server 2008 and a data store 2010. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio and/or video to be transferred to the user, which may be served to the user by the Web server in the form of HyperText Markup Language ("HTML"), Extensible Markup Language ("XML") or another appropriate structured language in this example. The handling of all requests and responses, as well as the delivery of content between the client device 2002 and the application server 2008, can be handled by the Web server. It should be understood that the Web and application servers are not required and are merely example components, as structured code discussed herein can be executed on any appropriate device or host machine as discussed elsewhere herein.

The data store 2010 can include several separate data tables, databases or other data storage mechanisms and media for storing data relating to a particular aspect. For example, the data store illustrated includes mechanisms for storing information which can be used by modules described herein, such as resource scheduling information 2012, route planning information 2014, segment reservation information 2016, and/or inventory information 2018. It should be understood that there can be many other aspects that may need to be stored in the data store, such as for page image information and to access right information, which can be stored in any of the above listed mechanisms as appropriate or in additional mechanisms in the data store 2010. The data store 2010 is operable, through logic associated therewith, to receive instructions from the application server 2008 and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 20. Thus, the depiction of the system 2000 in FIG. 20 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, and/or any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets)

or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based at least in part on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. An automated cooling system for a facility comprising a plurality of electronic components, the automated cooling system comprising:
   a plurality of temperature sensors for monitoring a corresponding plurality of temperatures of the electronic components;
   an automated cooling unit comprising:
      a drive assembly operable to move the automated cooling unit within the facility;
      a cooling assembly coupled with the drive assembly and positioned to direct air vertically from a vicinity of a floor beneath the automated cooling unit; and
      an onboard management component operable to control operation of the drive assembly and the cooling assembly; and
   a management component including at least one processor and tangible non-transitory memory storing instructions executable by the at least one processor to:
      receive information concerning a temperature event from the plurality of temperature sensors; and
      cause the automated cooling unit to:
         move to a vicinity of an electronic component of the plurality of electronic components that is affected by the temperature event; and
         operate the cooling assembly of the automated cooling unit to cool the electronic component that is affected by the temperature event.

2. The system of claim 1, wherein:
   the facility comprises a power supply station and a navigable floor space; and
   the automated cooling unit is operable to navigate the facility on the navigable floor space from the power supply station to the plurality of electronic components.

3. The system of claim 1, wherein:
   the facility comprises a power supply accessible from the vicinity of the electronic component of the plurality of electronic components; and
   the automated cooling unit is operable to access the power supply at the vicinity of the electronic component.

4. The system of claim 1, wherein:
   the facility comprises an air handler for supplying an airflow for cooling one or more of the plurality of electronic components; and
   the automated cooling unit is operable to:
      move to the vicinity of the air handler; and
      operate the cooling assembly to increase an airflow to or from one or more of the plurality of electronic components.

5. The system of claim 1, wherein:
the cooling assembly of the automated cooling unit comprises a fan, the fan being movable vertically with respect to the automated cooling unit, such that the fan can be positioned proximate to the electronic component that is affected by the temperature event.

6. The system of claim 1, further comprising a second automated cooling unit comprising:
a second drive assembly operable to move the second automated cooling unit within the facility;
a second cooling assembly coupled with the second drive assembly; and
a second onboard management component operable to control operation of the second drive assembly and the second cooling assembly; and
wherein the system is further configured to cause each of the first and second automated cooling units to move to respective vicinities of the plurality of electronic components based in part on the information concerning the temperature event.

7. A computer-implemented method, comprising:
receiving, at a management component, information concerning a temperature event at an electronic component in a facility;
causing an automated cooling unit to move from a first location in the facility to a second location based on the received information;
causing the automated cooling unit to deploy a cooling assembly by rotating the cooling assembly from a retracted position in which the cooling assembly lies in a substantially horizontal orientation along a top surface of the automated cooling unit, to a deployed position in which the cooling assembly is extended in a substantially vertical orientation above the top surface of the cooling unit; and
causing the automated cooling unit to generate, by the cooling assembly, a cooling flow of air to cool the electronic component.

8. The method of claim 7, further comprising:
determining a vertical position of the electronic component based in part on the received information; and
causing the automated cooling unit to raise or lower the cooling assembly to based on the vertical position of the electronic component.

9. The method of claim 7, further comprising:
determining a location of an air handler associated with the electronic component based on part on the received information;
causing the automated cooling unit to move to a vicinity of the air handler; and
causing the automated cooling unit to supplement a flow of air generated by the air handler.

10. The method of claim 7, further comprising:
identifying a priority of the electronic component based in part on the received information; and
determining whether to cause the automated cooling unit to move to a second location based in part on the priority of the electronic component.

11. The method of claim 10, wherein determining whether to cause the automated cooling unit to move to the second location comprises:
receiving availability information concerning availability of one or more additional automated cooling units; and
determining, based on the priority information and availability information, that the automated cooling unit is available to move to the second location.

12. The method of claim 7, further comprising:
detecting a low power alert for the automated cooling unit; and
causing the automated cooling unit to access an external power supply.

13. The method of claim 7, further comprising:
detecting an exception; and
stopping the cooling flow of air based at least in part on detecting the exception.

14. The method of claim 7, further comprising:
causing an indication to be generated for prompting a user to connect the automated cooling unit to an external power source.

15. A computer readable storage medium containing storing computer-executable instructions that, when executed by a processor, cause the processor to perform operations, comprising:
receiving information concerning a temperature event in a facility;
causing an automated cooling unit to move to a vicinity of an electronic component based on receiving the information; and
causing the automated cooling unit to deploy a cooling assembly to generate a cooling flow of air to cool the electronic component, wherein deploying the cooling assembly comprises rotating the cooling assembly from a retracted position in which the cooling assembly lies in a substantially horizontal orientation along a top surface of the automated cooling unit, to a deployed position in which the cooling assembly is extended in a substantially vertical position above the top surface of the cooling unit.

16. The computer readable storage medium of claim 15, wherein the operations further comprise:
determining that a power supply included in the automated cooling unit is depleted; and
causing the automated cooling unit to return to a charging station based in part on the determining that the onboard power supply is depleted.

17. The computer readable storage medium of claim 15, wherein the operations further comprise:
determining a proximity of the automated cooling unit to the electronic component; and
causing the automated cooling unit to move to the vicinity of the electronic component based in part on the proximity.

18. The computer readable storage medium of claim 15, wherein the operations further comprise:
detecting an exception; and
causing the automated cooling unit to move to a standby location based in part on detecting the exception.

19. The computer readable storage medium of claim 15, wherein the operations further comprise:
determining that a number of affected electronic components including the electronic component exceeds a number of available automated cooling units; and
causing the automated cooling unit to redeploy to a vicinity of an air handler associated with a subset of the affected electronic components.

20. The automated cooling system of claim 1, wherein:
the cooling assembly is rotatably coupled with the drive assembly and convertible between a retracted position, in which the cooling assembly lies in a substantially horizontal orientation along a top surface of the automated cooling unit, to a deployed position in which the cooling assembly is extended in a substantially vertical orientation above the top surface of the cooling unit; and the management component is further configured with instructions to cause the automated cooling unit to convert the cooling assembly from the retracted position to the deployed position.

21. The automated cooling system of claim 20, wherein:

the drive assembly comprises a vertically oriented void aligned with the cooling assembly when the cooling assembly is in the retracted position;

the cooling assembly is operable, in the retracted position, to move air vertically through the vertically oriented void; and the cooling assembly is operable, in the deployed position, to move air horizontally above the drive assembly.

* * * * *